(12) United States Patent
Barlocchi et al.

(10) Patent No.: US 7,348,257 B2
(45) Date of Patent: Mar. 25, 2008

(54) PROCESS FOR MANUFACTURING WAFERS OF SEMICONDUCTOR MATERIAL BY LAYER TRANSFER

(75) Inventors: Gabriele Barlocchi, Cornaredo (IT); Flavio Francesco Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 107 days.

(21) Appl. No.: 11/225,883

(22) Filed: Sep. 13, 2005

(65) Prior Publication Data
US 2006/0063352 A1    Mar. 23, 2006

(30) Foreign Application Priority Data
Sep. 16, 2004    (EP) ................................ 04425687

(51) Int. Cl.
*H01L 21/30* (2006.01)
(52) U.S. Cl. .................. 438/456; 438/458; 438/526; 438/715; 257/E21.568; 257/E21.57
(58) Field of Classification Search ................ 438/456, 438/458, 107, 476, 479, 526, 715, 716; 257/E21.568, 257/E21.57
See application file for complete search history.

(56) References Cited

U.S. PATENT DOCUMENTS
2004/0142542 A1   7/2004   Murphy et al. ............. 438/479

FOREIGN PATENT DOCUMENTS
EP    1 043 770 A1    10/2000
EP    1 427 010 A1     6/2004

OTHER PUBLICATIONS

Sato, T., et al., "A New Substrate Engineering for the Formation of Empty Space in Silicon (ESS) Induced by Silicon Surface Migration," *IEDM 1999*, pp. 517-520.

*Primary Examiner*—Hsien-Ming Lee
(74) *Attorney, Agent, or Firm*—Lisa K. Jorgenson; Hai Han; Seed IP Law Group PLLC

(57) ABSTRACT

A process manufactures a wafer using semiconductor processing techniques. A bonding layer is formed on a top surface of a first wafer; a deep trench is dug in a substrate of semiconductor material belonging to a second wafer. A top layer of semiconductor material is formed on top of the substrate so as to close the deep trench at the top and form at least one buried cavity. The top layer of the second wafer is bonded to the first wafer through the bonding layer. The two wafers are subjected to a thermal treatment that causes bonding of at least one portion of the top layer to the first wafer and widening of the buried cavity. In this way, the portion of the top layer bonded to the first wafer is separated from the rest of the second wafer, to form a composite wafer.

25 Claims, 2 Drawing Sheets

PROCESS FOR MANUFACTURING WAFERS OF SEMICONDUCTOR MATERIAL BY LAYER TRANSFER

BACKGROUND OF THE INVENTION

1. Field of the Invention

The present invention relates to a process for manufacturing wafers of semiconductor material by layer transfer. In the following description particular reference is made to the fabrication of silicon-on-insulator (SOI) wafers, without, however, the invention being limited thereto.

2. Description of the Related Art

As is known, SOI wafers are formed by two silicon layers, one of which is thinner than the other, separated by a silicon oxide layer. Lately, SOI wafers have received considerable attention because integrated circuits having substrates formed from these wafers have considerable advantages as compared to the same circuits formed on traditional substrates formed only by monocrystalline silicon.

A typical process for manufacturing SOI wafers, described in the article "Silicon-on-Insulator Wafer Bonding-Wafer Thinning Technological Evaluations" by J. Hausman, G. A. Spierings, U. K. P. Bierman and J. A. Pals, Japanese Journal of applied Physics, Vol. 28, No. 8, August 1989, pp. 1426-1443, is based upon the bonding of two wafers of monocrystalline silicon (wafer-bonding process). The wafers obtained with the traditional method of wafer bonding have excellent electrical characteristics but decidedly high costs. Another problem lies in the fact that the grinding operations necessary for thinning one of the two silicon layers are costly and delicate on account of the brittleness of the material. For the same reason, the yield of the process is not very high.

A process called "smart cut™" has then been proposed (see, for example, "Hydrogen-induced silicon surface layer cleaverage" Xian Lu, Nathan W. Cheung, Michael D. Strathman, Paul K. Chu, Brian Doyle, Appl. Phys. Lett., Vol. 71, No. 13, Sep. 29, 1997, pp. 1804-1806), which is based upon the bonding of two wafers, whereof a first one has undergone a hydrogen implant, which, during an appropriate annealing step, causes the formation of microcavities filled with hydrogen molecules. By subjecting the composite wafer to an annealing step at an appropriate temperature, the microcavities grow on a horizontal plane parallel to the surface of the composite wafer and cause the separation of the first wafer (which has undergone implantation) into two parts, one of which is bonded to the second wafer. Thus, a SOI wafer is obtained, having a monocrystalline silicon layer, the thickness whereof depends upon the implantation depth. The SOI wafer thus obtained is then subjected to lapping, to obtain the desired smoothness.

The above process, however, proves very costly on account of the operations of hydrogen implantation and lapping.

BRIEF SUMMARY OF THE INVENTION

One embodiment of the present invention provides a low-cost process for manufacturing SOI wafers. In particular, the process including:

providing a first wafer;

providing a second wafer having a substrate of semiconductor material;

digging a deep trench in the substrate;

forming a top layer of semiconductor material on the substrate so as to close the deep trench at the top and form a buried cavity;

providing a bonding region between the first and second wafers, the bonding region being formed on a surface of the first wafer;

bringing into mutual contact the first and the second wafers, with the top layer of the second wafer facing the first wafer and in contact with the bonding region; and carrying out a thermal treatment so as to cause bonding of a portion of the top layer to the first wafer through the bonding region to provide a bonded portion, and the thermal treatment further widening of the buried cavity to form a widened cavity separating the bonded portion of the top layer from the rest of the second wafer, to form a final composite wafer.

BRIEF DESCRIPTION OF THE SEVERAL VIEWS OF THE DRAWINGS

For understanding the present invention, preferred embodiments are now described, provided purely by way of non-limiting example, with reference to the attached drawings, wherein.

DETAILED DESCRIPTION OF THE INVENTION

Figure 1:
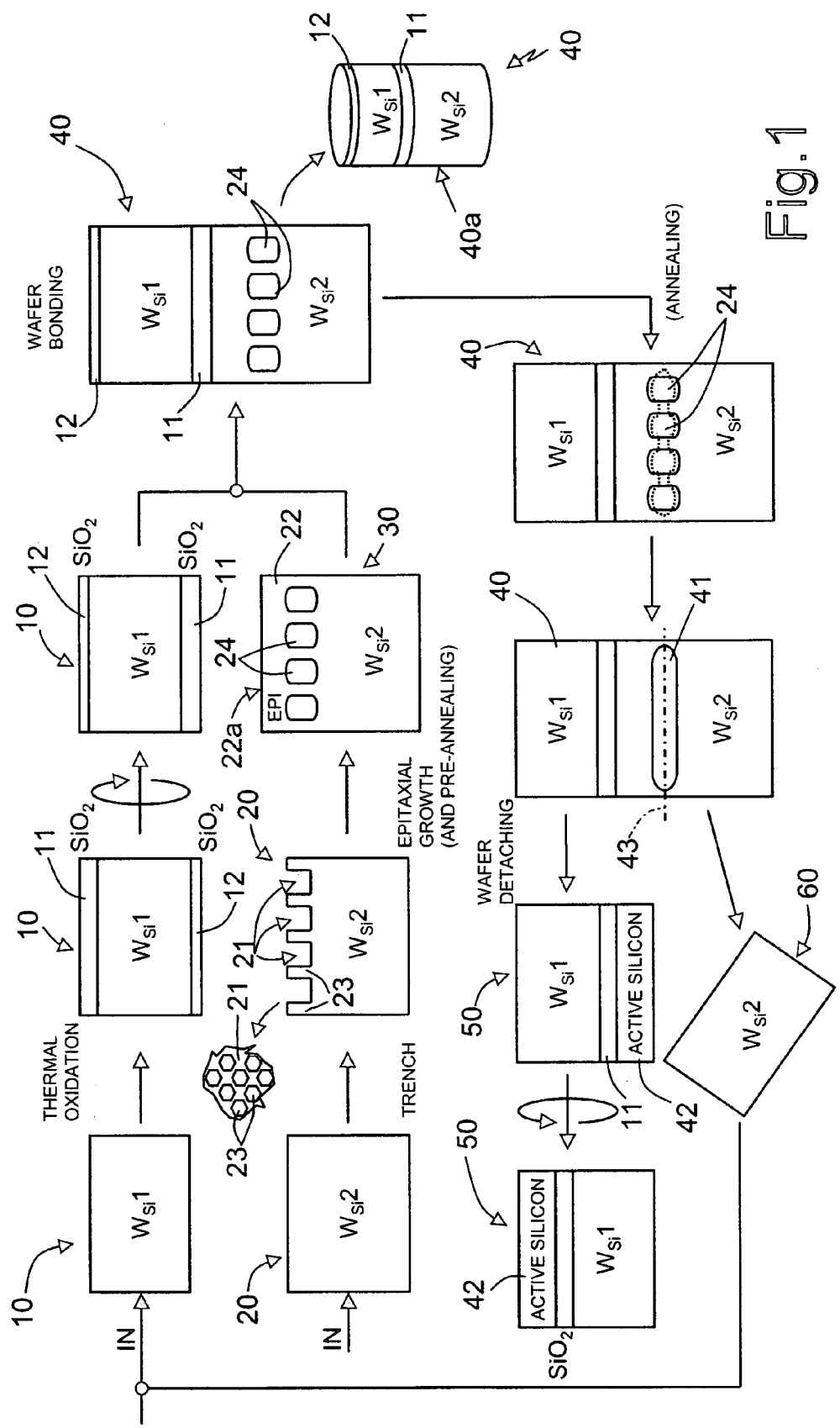
FIG. 1 shows a first operation flow for manufacturing a SOI wafer, according to a first embodiment of the invention.

With reference to FIG. 1, initially a first wafer 10 comprising a substrate $W_{Si}1$ of monocrystalline silicon is subjected to a thermal oxidation for forming an insulating layer 11 of silicon oxide on the front surface; in addition, a silicon oxide rear layer 12 is formed on the rear surface. Then the first wafer 10 is turned upside down.

Simultaneously, before or after the operations described above, a second wafer 20 comprising a substrate $W_{Si}2$ of monocrystalline silicon is subjected to a trench-digging operation, as described in U.S. Patent Publication No. 2003/0168711 in the name of STMicroelectronics, S.r.l., the assignee of the present application, which application is incorporated herein by reference in its entirety.

In particular, using an appropriate mask (not shown) the second wafer 20 is anisotropically etched for forming one or more deep trenches 21. For example, as described in U.S. Patent Publication No. 2003/0168711, it is possible to make a single deep trench 21 forming a grid or labyrinth that separates from one another by columns 23 of a hexagonal shape (see the detail of the top view showing a portion of the grid-shaped deep trench 21 and of the columns 23); in this case, the deep trench 21 can be formed by branches having a width (i.e., the distance between parallel sides facing one another of two adjacent columns) equal to approximately 1-2 μm, while the hexagonal columns can have a width (i.e., the distance between parallel sides) of approximately 2 μm.

Next, an epitaxial growth is carried out in a deoxidizing environment (typically, in an atmosphere with a high concentration of hydrogen, preferably using trichlorosilane-$SiHCl_3$). Consequently, an epitaxial layer 22 grows on top of the columns of silicon and closes the deep trench 21 at the top, trapping the gas (hydrogen molecules $H_2$). In this way, a second wafer 30 is formed, which has a top surface 22a (top surface of the epitaxial layer 22). The thickness of the epitaxial layer 22 depends upon the desired thickness of the active layer, as explained hereinafter (for example, 5-20 μm). During the epitaxial growth, the silicon is deposited in part also within the deep trench 21 before the latter is closed at the top, to form one or more buried cavities 24, which are completely surrounded by silicon and have an approximately rectangular cross section, rounded at the edges.

Later, the first and the second wafers 10, 30 are bonded together, setting the insulating layer 11 of the first wafer 10 in contact with the top surface 22a of the second wafer 30 at an appropriate pressure and temperature (as known to a person skilled in the art), to obtain a composite wafer 40 having a cylindrical side surface 40a.

Subsequently, an annealing is carried out in a deoxidizing atmosphere at a temperature higher than 1000° C. In these conditions, the silicon atoms at the surface that surround the buried cavity 24 migrate and tend to assume a minimum-energy configuration. Thereby, a progressive widening is obtained in the horizontal direction of the buried cavity 24, which forms a continuous cavity 41 extending as far as the side surface 40a of the composite wafer 40. Consequently, the portion of silicon comprised between the elongated cavity 41 and the insulating layer 11 (hereinafter referred to as active layer 42, corresponding approximately to the epitaxial layer 22 grown on the second wafer 20) completely detaches along a separation line 43. In practice, two wafers are formed: a final wafer 50 comprising the substrate $W_{Si}1$, the insulating layer 11, and the active layer 42, and a discard wafer 60, which can possibly be reused as first wafer 1 for a subsequent layer-transfer step.

The final wafer 50 thus obtained has a high smoothness, and hence does not require the lapping necessary in the "smart-cut™" process. Furthermore, the process described does not require any hydrogen implant, and thus the manufacturing costs are considerably lower than in known processes. The process described moreover enables SOI wafers to be obtained having an active layer 42 of small depth, without any grinding operations being required, as is necessary, instead, with the standard bonding process for thinning the useful silicon layer. In particular, with the present process, the depth can be chosen according to the desired applications, being linked directly to the thickness of the grown epitaxial layer 22.

In the process described, at the moment of detachment of the active layer 42 from the discard wafer, it is necessary to withhold the final wafer 50 to prevent the weight of the final wafer 50, together with the temperature necessary for carrying out annealing, from causing again bonding of the final wafer 50 to the discard wafer 60. Alternatively, it is possible to use a different process, illustrated in FIG. 2.

Figure 2:
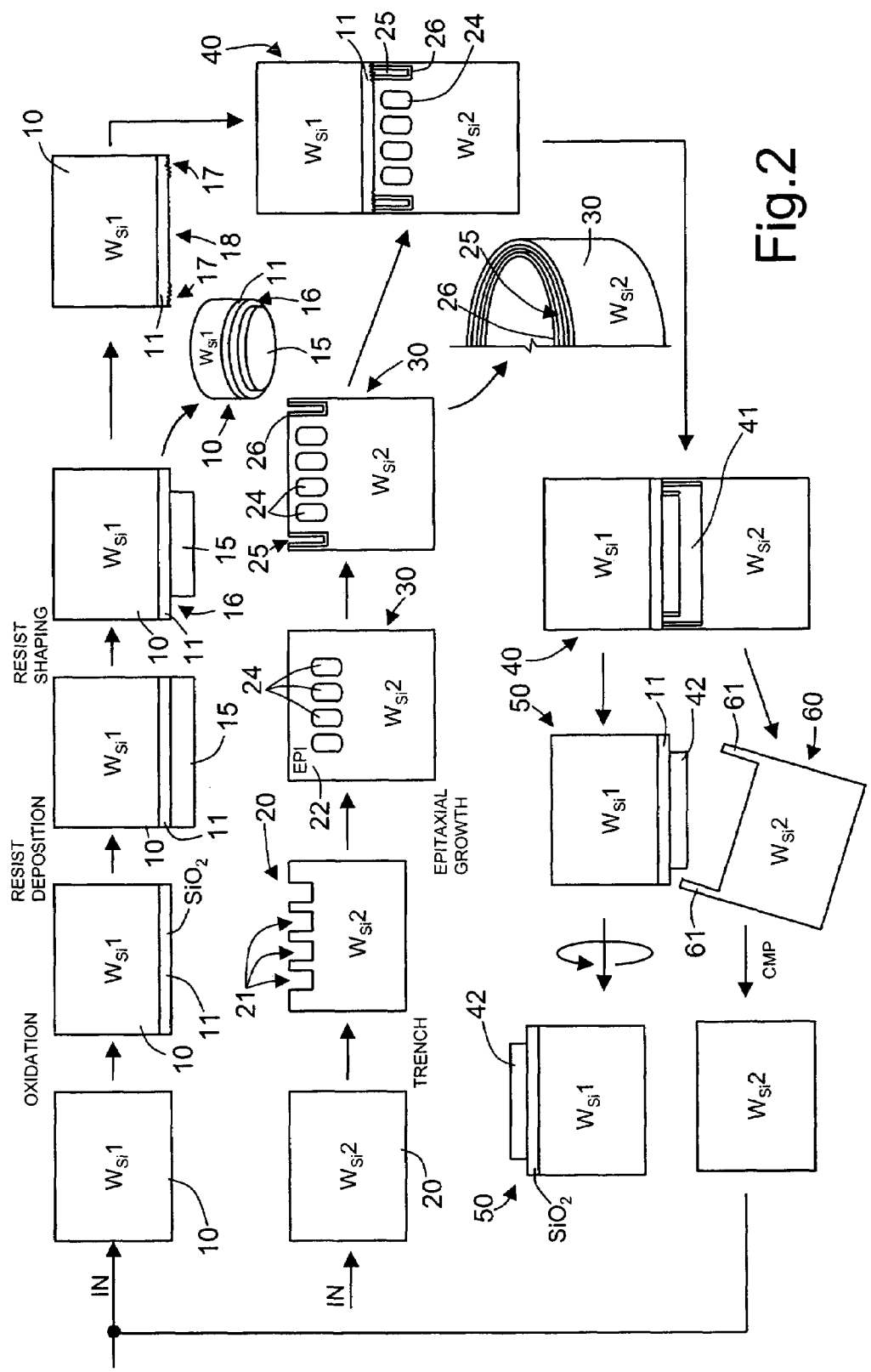
FIG. 2 shows a second operation flow for manufacturing a SOI wafer, according to a second embodiment of the invention.

In detail, in FIG. 2, initially on the rear surface of a first wafer 10 comprising a substrate $W_{Si}1$ of monocrystalline silicon an insulating layer 11 is formed. Also in this case, generally, the insulating layer 11 is formed on the top surface of the first wafer 10, which is then turned upside down.

Next, adjacent to the insulating layer 11, a resist layer 15 is formed (here on the rear side of the first wafer 1); and the resist layer 15 is shaped to form a peripheral annulus or border 16. This operation is carried out in a known way, it being a routine operation.

Then, the first wafer 10 undergoes an oxygen-plasma etch ($O_2$) so as to render the rear surface of the insulating layer 11 rough at the border 16, as represented schematically and in an exaggerated way by 17. The etching operation moreover causes gradual removal of the resist layer 15. Any possible residual resist is in any case then removed. The surface of the insulating layer 11 thus has a smooth area 18 having a low standard roughness (less than 100 nm) and a peripheral rough area 17, with a circular shape, having a very high roughness (much greater than 100 nm).

Simultaneously, before or after the operations described above, a second wafer 20 comprising a substrate $W_{Si}2$ of monocrystalline silicon is subjected to a trench-digging operation, as described with reference to FIG. 1, for forming one or more deep trenches 21.

Then, as in FIG. 1, an epitaxial growth is carried out in a deoxidizing atmosphere. Thus, a second wafer 30 is obtained, having one or more buried cavities 24 covered by a top layer 22.

Subsequently, a delimitation trench 25 is dug in the second wafer 30, for example with a circular shape, surrounding the area accommodating the buried cavity 24. The delimitation trench 24 is formed at a distance from the cylindrical side surface of the second wafer 30 at most equal to the width of the rough area 17, as explained in detail hereinafter.

Then, a thermal oxidation is carried out, thus forming an oxide layer 26 coating the walls of the delimitation trench 25. Possibly, oxidation can be carried out in the presence of the mask of oxide and nitride (not shown) used for forming the trench; this mask can be kept in so far as it does not disturb the subsequent bonding. Alternatively, the mask is removed, and a silicon oxide layer is formed on the surface 22a of the second wafer 30; also in this case, this layer (not shown) does not hamper bonding.

Next, the first and the second wafers 10, 30 are bonded together, as described above. In this case, bonding is carried out at just the smooth area 18, and not the rough area 17, which, on account of its mechanical characteristics, does not enable a sufficient adhesion between the two wafers. In practice, a composite wafer 40 is obtained, wherein only the central part of the wafer, corresponding to the smooth area 18 of the insulating layer 11, is bonded, while the annular peripheral area, corresponding to the rough area 17, is not bonded. If the distance of the outer periphery of the delimitation trench 25 from the outer edge of the second wafer 20 is at the most equal to the width of the annulus forming the rough area 17, the area of lack of adhesion between the wafers 10, 30 will coincide approximately with the rough area 17.

Also in this case, by carrying out bonding at a high temperature (higher than 1000° C.) and/or then performing an annealing at a high temperature, the silicon atoms migrate into the second wafer 30 and the elongated cavity 41 is formed. As soon as the elongated cavity 41 reaches the delimitation trench 25, on account of the lack of adhesion of the second wafer 30 to the first wafer 10 at the rough area 17, the portion of silicon comprised between the elongated cavity 41 and the insulating layer 11 (also here referred to as active layer 42) is detached from the rest of the second wafer 30. In practice, upon opening the bonding apparatus, there are two wafers: a final wafer 50 comprising the substrate $W_{Si}1$, the insulating layer 11, and the active layer 42; and a discard wafer 60.

In this case, the presence of the oxide layer 26 prevents the elongated cavity 41 from extending as far as the side edge of the composite wafer 40 and hence causes the discard wafer 60 to have a projecting region 61, of annular shape, facing the rough area 17. Given that the rough area 17 is unable to bond to the projecting region 61, the two wafers 50 and 60 remain separated, and no re-bonding thereof can occur.

Finally, possibly, the final wafer 50 can be reused as first wafer 1 for a subsequent layer transfer step, after undergoing CMP or some other treatment for elimination of the projecting region 61.

Also with the process described with reference to FIG. 2 it is hence possible to obtain a SOI wafer of high quality at much lower costs than those of the known solutions. This second solution moreover affords the advantage of guaranteeing automatic detachment of the second wafer 30 without any risk of re-bonding of the wafers 50, 60.

Finally, it is clear that numerous modifications and variations can be made to the process described and illustrated herein, all falling within the scope of the invention, as defined in the annexed claims. For example, the process described with reference to FIG. 2 can be used also to obtain the transfer of one or more silicon areas of limited size, smaller than the entire wafer, by modifying appropriately the shape and/or the dimensions of the area 16 that undergoes plasma etching and/or by appropriately modifying the shape of the delimitation trench 25. In this way, a final composite wafer would be obtained, comprising the first wafer 10 and only one or more active regions 42, corresponding to portions of the epitaxial layer 22, bonded to the first wafer 10 through the insulating layer 11 or portions thereof.

Alternatively to the above, instead of using a first wafer 10 formed by a substrate $W_{Si}1$ of monocrystalline silicon, a substrate of any other material could be used, for example, glass or silicon carbide, provided that it has characteristics of thermal expansion comparable to those of silicon in order to prevent any mismatch between the two materials and hence the setting-up of stress conditions. The process is moreover applicable to second wafers 20 of a different semiconductor material.

Furthermore, the insulating layer 11 could be obtained by depositing a suitable material, for example, TEOS (tetra-ethylorthosilicate); the insulating layer 11 could also be formed on the second wafer 30, instead of on the first wafer 10.

Finally, the shape of the deep trench 21 (and thus of the buried cavity 24) can be different from the above described. In particular, a plurality of deep trenches may be formed, which are set apart from one another so as to enable in any case silicon migration and formation of the elongated cavity 41; for example, the deep trenches can be strip-shaped, extending in a direction perpendicular to the plane of the drawing, or else be formed by a series of adjacent labyrinthine trenches, equal to one another or different.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process for manufacturing a composite wafer, comprising the steps of:
   providing a first wafer;
   providing a second wafer having a substrate of semiconductor material;
   digging a trench in said substrate;
   forming a top layer of semiconductor material on said substrate so as to close said trench at the top of the deep trench and form a buried cavity;
   forming a bonding region on a surface of at least one of said first and second wafers;
   bringing into mutual contact said first and said second wafers, with said top layer of said second wafer facing said first wafer and in contact with said bonding region; and
   carrying out a thermal treatment so as to cause bonding of a portion of said top layer to said first wafer through said bonding region to provide a bonded portion, and said thermal treatment further widening said buried cavity to form a widened cavity separating the bonded portion of said top layer from the rest of said second wafer, to form a final composite wafer, wherein said first wafer is of semiconductor material and said step of forming a bonding region comprises carrying out a thermal oxidation of the surface of said first wafer.

2. The process according to claim 1, wherein said step of forming a top layer comprises carrying out an epitaxial growth in a deoxidizing environment.

3. The process according to claim 2, wherein said deoxidizing environment comprises hydrogen atoms.

4. The process according to claim 1, wherein said step of forming a bonding region comprises depositing an insulating layer on said first wafer.

5. The process according to claim 1, wherein said step of carrying out a thermal treatment comprises bonding said first and second wafers at a pressure and temperature and carrying out an annealing in a deoxidizing environment.

6. The process according to claim 5, wherein said annealing is carried out at a temperature higher than 1000° C.

7. The process according to claim 1, wherein said widened cavity separates said final composite wafer from a discard wafer and said discard wafer is used as said first wafer for forming a further final composite wafer.

8. The process according to claim 1, wherein said buried cavity has a grid-like structure.

9. The process according to claim 1, wherein said step of carrying out a thermal treatment comprises forming an intermediate composite wafer having a cylindrical side surface and going on with widening said buried cavity until the cylindrical side surface is reached, so that said final composite wafer comprises a substrate formed by said first wafer, said bonding region, and said top layer.

10. The process according to claim 1, wherein:
    said step of forming a bonding region comprises forming an insulating layer on said first wafer; wherein, before bringing into mutual contact said first and second wafers, a portion of said insulating layer is subjected to a process of roughening to form at least one rough area, and a delimitation trench is dug in said top layer of said second wafer at a depth at least approximately equal to that of said buried cavity;
    during said step of bringing into mutual contact said first and second wafers, said delimitation trench is brought proximate to said rough area; and
    widening said buried cavity until said delimitation trench is reached so that said bonded portion of said second wafer is delimited laterally by said delimitation trench.

11. The process according to claim 10, wherein said delimitation trench is subjected to an oxidation prior to said step of bringing said first and second wafers into mutual contact.

12. The process according to claim 10, wherein said rough area extends along a peripheral area of said first wafer and said delimitation trench extends next to a cylindrical side surface of said second wafer.

13. The process according to claim 10, wherein said step of subjecting to a process of roughening comprises carrying out an oxygen-plasma etch.

14. An intermediate semiconductor composite comprising:
   a first wafer comprising a bonding region surrounded by a non-bonding region, said non-bonding region having a width D1 and being on a peripheral region of the first wafer;
   a second wafer of a semiconductor material;
   an insulating layer between the first and second wafers, said insulating layer being bonded to said first and second wafer;
   a cavity in the second wafer, said cavity being filled with a deoxidizing gas, wherein the deoxidizing gas is hydrogen.

15. The intermediate semiconductor composite of claim 14 wherein the insulating layer is silicon oxide.

16. The intermediate semiconductor composite of claim 14 wherein the second wafer comprising a delimitation trench surrounding the cavity, said delimitation trench being at a distance D2 from a periphery of the second wafer.

17. The intermediate semiconductor composite of claim 16 wherein D2 is no wider than D1.

18. The intermediate semiconductor composite of claim 14 wherein the bonding region is smooth and the non-bonding region is rendered rough through plasma etching.

19. A process for manufacturing a composite wafer, comprising the steps of:
   providing a first wafer;
   providing a second wafer having a substrate of semiconductor material;
   digging a trench in said substrate;
   forming a top layer of semiconductor material on said substrate so as to close said deep trench at the top of the trench and form a buried cavity;
   forming a bonding region on a surface of at least one of said first and second wafers;
   bringing into mutual contact said first and said second wafers, with said top layer of said second wafer facing said first wafer and in contact with said bonding region; and
   carrying out a thermal treatment so as to cause bonding of a portion of said top layer to said first wafer through said bonding region to provide a bonded portion, and said thermal treatment further widening said buried cavity to form a widened cavity separating the bonded portion of said top layer from the rest of said second wafer, to form a final composite wafer, wherein said step of carrying out a thermal treatment comprises forming an intermediate composite wafer having a cylindrical side surface and going on with widening said buried cavity until the cylindrical side surface is reached, so that said final composite wafer comprises a substrate formed by said first wafer, said bonding region, and said top layer.

20. The process of claim 19 wherein said step of forming a top layer comprises carrying out an epitaxial growth in a deoxidizing environment.

21. The process according to claim 20, wherein said deoxidizing environment comprises hydrogen atoms.

22. A process for manufacturing a composite wafer, comprising the steps of:
   providing a first wafer;
   providing a second wafer having a substrate of semiconductor material;
   digging a trench in said substrate;
   forming a top layer of semiconductor material on said substrate so as to close said deep trench at the top of the trench and form a buried cavity;
   forming a bonding region on a surface of at least one of said first and second wafers;
   bringing into mutual contact said first and said second wafers, with said top layer of said second wafer facing said first wafer and in contact with said bonding region; and
   carrying out a thermal treatment so as to cause bonding of a portion of said top layer to said first wafer through said bonding region to provide a bonded portion, and said thermal treatment further widening said buried cavity to form a widened cavity separating the bonded portion of said top layer from the rest of said second wafer, to form a final composite wafer, wherein, said step of forming a bonding region comprises:
   forming an insulating layer on said first wafer, wherein, before bringing into mutual contact said first and second wafers, a portion of said insulating layer is subjected to a process of roughening to form at least one rough area, and a delimitation trench is dug in said top layer of said second wafer at a depth at least approximately equal to that of said buried cavity; and during said step of bringing into mutual contact said first and second wafers, said delimitation trench is brought proximate to said rough area; and
   widening said buried cavity until said delimitation trench is reached so that said bonded portion of said second wafer is delimited laterally by said delimitation trench.

23. The process according to claim 22, wherein said delimitation trench is subjected to an oxidation prior to said step of bringing said first and second wafers into mutual contact.

24. The process according to claim 22, wherein said rough area extends along a peripheral area of said first wafer and said delimitation trench extends next to a cylindrical side surface of said second wafer.

25. The process according to claim 22, wherein said step of subjecting to a process of roughening comprises carrying out an oxygen-plasma etch.

* * * * *

UNITED STATES PATENT AND TRADEMARK OFFICE
CERTIFICATE OF CORRECTION

PATENT NO. : 7,348,257 B2  Page 1 of 1
APPLICATION NO. : 11/225883
DATED : March 25, 2008
INVENTOR(S) : Gabriele Barlocchi et al.

It is certified that error appears in the above-identified patent and that said Letters Patent is hereby corrected as shown below:

Column 6
Line 2, "to close said trench at the top of the deep trench" should read as -- to close said trench at the top of the trench --

Column 7
Line 39, "to close said deep trench at the top" should read as -- to close said trench at the top --

Column 8
Line 16, "to close said deep trench at the top" should read as -- to close said trench at the top --

Signed and Sealed this

Nineteenth Day of August, 2008

JON W. DUDAS
*Director of the United States Patent and Trademark Office*